United States Patent
Bach et al.

(10) Patent No.: US 8,058,086 B2
(45) Date of Patent: Nov. 15, 2011

(54) SELF-ORGANIZED PIN-TYPE NANOSTRUCTURES, AND PRODUCTION THEREOF ON SILICON

(75) Inventors: Konrad Bach, Tiefthal (DE); Daniel Gaebler, Ilmenau (DE); Michael Fischer, Uhlstaedt-Kirchhasel (DE); Mike Stubenrauch, Ilmenau (DE)

(73) Assignees: X-FAB Semiconductor Foundries AG, Erfurt (DE); Technische Universitaet Ilmenau, Ilmenau (DE)

( * ) Notice: Subject to any disclaimer, the term of this patent is extended or adjusted under 35 U.S.C. 154(b) by 464 days.

(21) Appl. No.: 12/089,724

(22) PCT Filed: Oct. 10, 2006

(86) PCT No.: PCT/EP2006/067248
§ 371 (c)(1),
(2), (4) Date: Apr. 16, 2009

(87) PCT Pub. No.: WO2007/042520
PCT Pub. Date: Apr. 19, 2007

(65) Prior Publication Data
US 2011/0127641 A1 Jun. 2, 2011

(30) Foreign Application Priority Data
Oct. 10, 2005 (DE) .................. 10 2005 048 366

(51) Int. Cl.
*H01L 21/00* (2006.01)
(52) U.S. Cl. ............ 438/34; 438/73; 438/706; 438/737; 257/618; 257/656; 257/E29.336

(58) Field of Classification Search .................. 438/34, 438/73, 706, 737; 257/618, 656, E29.336
See application file for complete search history.

(56) References Cited

U.S. PATENT DOCUMENTS

| | | | | |
|---|---|---|---|---|
| 3,493,822 A * | 2/1970 | Iles | ................. | 136/256 |
| 4,717,448 A | 1/1988 | Cox et al. | | |
| 4,778,563 A * | 10/1988 | Stone | ............. | 438/714 |
| 5,429,708 A * | 7/1995 | Linford et al. | ................. | 216/66 |
| 6,038,065 A | 3/2000 | Borden | | |
| 6,091,021 A | 7/2000 | Ruby et al. | | |
| 6,329,296 B1 | 12/2001 | Ruby et al. | | |
| 6,579,777 B1 * | 6/2003 | Yen et al. | ....................... | 438/444 |

(Continued)

FOREIGN PATENT DOCUMENTS

DE 690 26 469 T2 4/1996

(Continued)

OTHER PUBLICATIONS

Jansen, De Boer, Otter, Elwenspoek; "The Black Silicon Method IV"; in: Micro Electro Mechanical Systems; 1995; IEEE; Jan. 29, 1995; pp. 88-93.

(Continued)

*Primary Examiner* — Tu-Tu Ho
(74) *Attorney, Agent, or Firm* — Stevens & Showalter LLP

(57) ABSTRACT

By means of an RIE etch process for silicon (3), a pin-type structure (4,4a) without crystal defects is formed with high aspect ratio and with nano dimensions on the surface of silicon wafers without any additional patterning measures (e-beam, interference lithography, and the like) by selecting the gas components of the etch plasma in self-organization wherein, among others, a broadband antireflective behavior is obtained that may be applicable in many fields.

34 Claims, 3 Drawing Sheets

U.S. PATENT DOCUMENTS

| | | |
|---|---|---|
| 6,946,362 B2 | 9/2005 | Gore et al. |
| 2002/0000244 A1 | 1/2002 | Zaidi |
| 2002/0022339 A1 | 2/2002 | Kirchhoff |
| 2005/0244324 A1 | 11/2005 | Hatta et al. |
| 2006/0251995 A1 | 11/2006 | Wille et al. |

FOREIGN PATENT DOCUMENTS

| | | |
|---|---|---|
| DE | 199 12 737 A1 | 6/2000 |
| DE | 100 36 725 C2 | 11/2002 |
| DE | 102 39 642 B3 | 6/2004 |
| DE | 102 39 643 B3 | 6/2004 |
| DE | 44 15 567 B4 | 11/2004 |
| DE | 103 52 423 B3 | 1/2005 |
| DE | 103 93 222 T5 | 9/2005 |
| EP | 0 427 395 B1 | 5/1991 |
| EP | 1 215 513 A1 | 6/2002 |
| EP | 1 536 461 A1 | 6/2005 |
| GB | 2 289 060 A1 | 11/1995 |
| WO | 96 08036 A1 | 3/1996 |
| WO | 02 13279 A2 | 2/2002 |
| WO | 02 13279 A3 | 2/2002 |
| WO | 2004 021452 A2 | 3/2004 |
| WO | 2005 045941 A2 | 5/2005 |
| WO | 2005 053037 A1 | 6/2005 |

OTHER PUBLICATIONS

De Rosa, Addonizio, Chiacchio, Roca, Tucci;: "Plasma Etching Conditioning of Textured Crystalline Silicon Surfaces . . . "; in: Mat. Res. Soc. Symp. Proc.; May 4, 1999; vol. 557; pp. 585-590.

Schnell, Lindemann, Schaefer; Plasma Surface Texturization for Multicrystalline Silicon Solar Cells; in: Photovoltaic Specialists Conference; 2000; IEEE; pp. 367-370.

Ruby, Zaidi, Narayanan; "Plasma-Texturization for Multicrystalline Silicon Solar Cells"; in: Photovoltaic Specialist Conference; 2000; IEEE; pp. 75-78.

Zaidi, Ruby,Gee; "Characterization of Random Reactive Ion Etched-Textured Silicon . . . "; in: IEEE Transactions on Electron Devices; vol. 48; No. 6; Jun. 2001; pp. 1200-1206.

Kanechia, Sugimoto, Mitsushima; "Study on a Condition for Forming the High Density of Silicon . . . "; in: Journal of Vac. Sci. Technol. B; vol. 20, Issue 5; Sep./Oct. 2002; pp. 1843-1846.

Kumaravelu, Alkaisi, Bittar; "Surface Texturing for Silicon Solar Cells Using Reactive Ion . . . "; in: Photovoltaic Specialist Conference; 2002; IEEE; pp. 258-261.

Jansen, De Boer, Legtenberg, Elvenspoek; "The Black Silicon Method: A Universal Method for Determining the Parameter Setting of a Fluorine-based Reactive Ion Etcher in Deep Silicon Trench Etching with Profile Control"; J. Micromech, Microeng.; vol. 5; 1995; pp. 115-120.

Wilson, Hutley; "The Optical Properties of "Moth Eye" Antireflection Surfaces"; Optica ACTA; vol. 29, No. 7; 1982; pp. 993-1009.

Bressers, Kelly, Gardeniers, Elvenspoek; "Surface Morphologie of p-Type (100) Silicon Etched in Aqueous Alkaline Solution"; J. Electrochem. Soc.; vol. 143, No. 5; May 1996; pp. 1744-1750.

Ehrlich, Hudda; "Atomic View of Surface Self-Diffusion: Tungsten on Tungsten"; The Journal of Chemical Physics; vol. 44, No. 3; Feb. 1, 1966; pp. 1039-1049.

Deckmann, Dunsmuir; "Natural lithographie"; Appl. Phys. Lett. 41 (4); Aug. 15, 1982; pp. 377-379.

Bradley, Harper; "Theory of Ripple Topography Induced by Ion Bombardment"; J. Vac. Sci. Technol. A 6 (4); Jul./Aug. 1988; pp. 2390-2395.

Klopfenstein, P.; International Search Report for PCT/EP20061067248—mailed Apr. 10, 2007.

Dreschers, Diana; Partial International Search Report for PCT/EP2006/067249—mailed Feb. 11, 2008.

Visentin, Alberto; International Search Report for PCT/EP2006/067249—mailed Mar. 3, 2008.

* cited by examiner

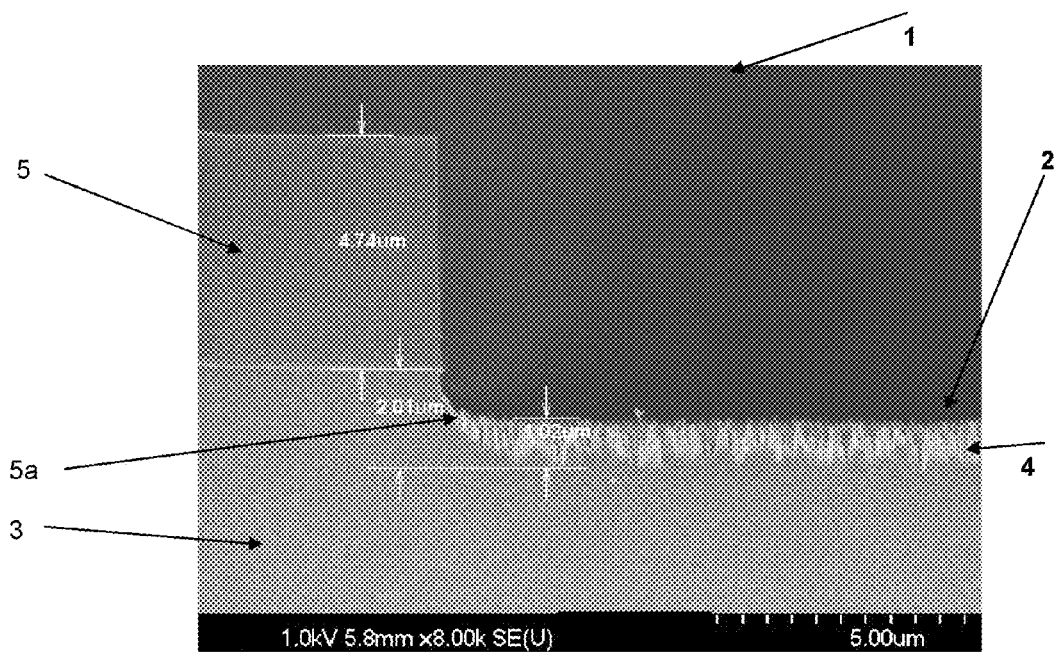
Fig. 1
Fig. 2
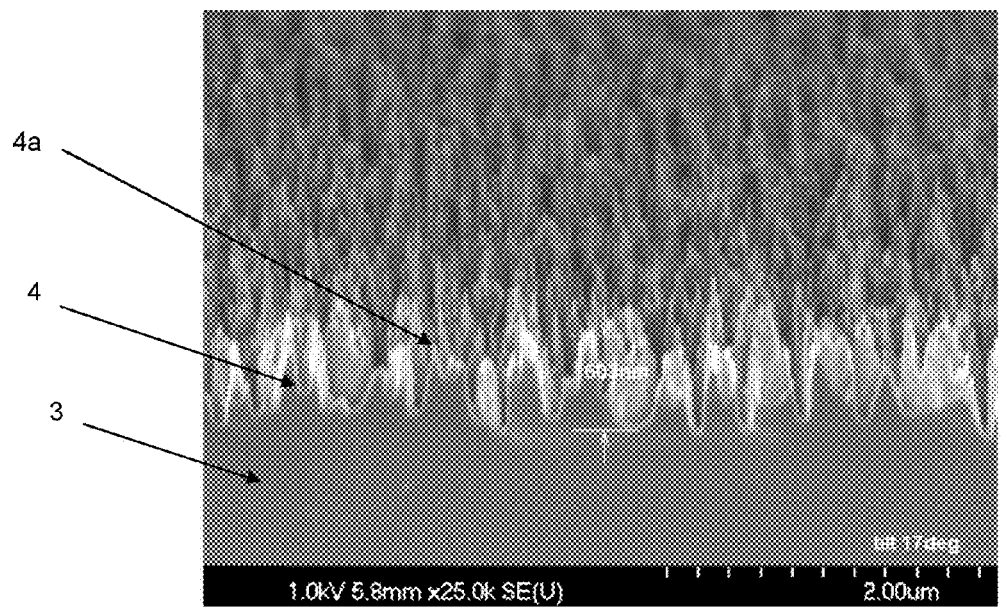

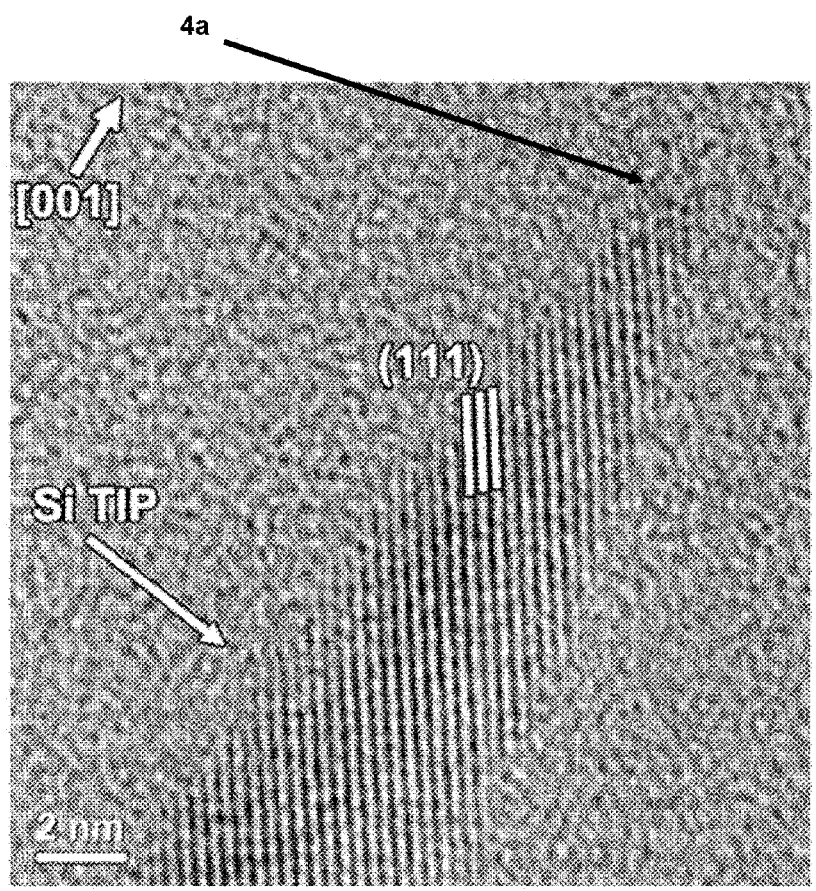
Fig. 3
Fig. 3a
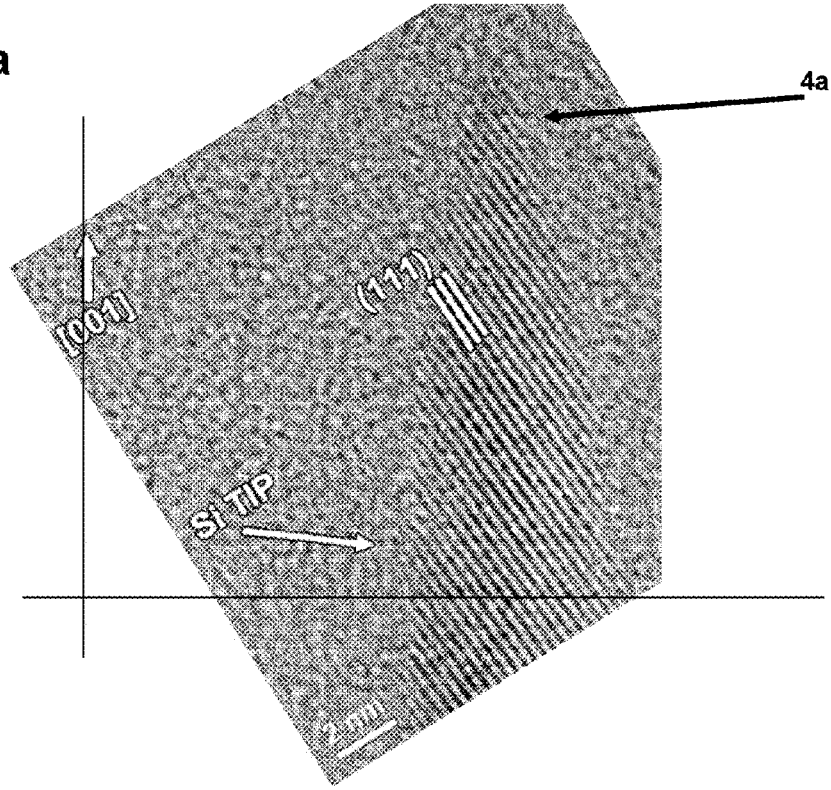

Fig. 4a  Fig. 4b  Fig. 4c
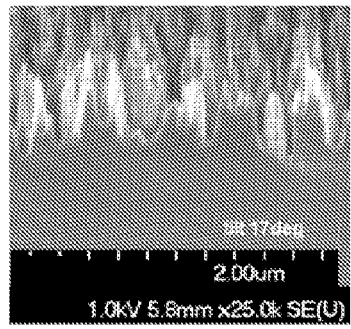 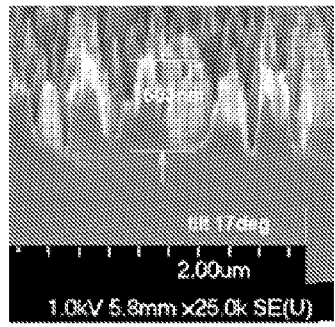 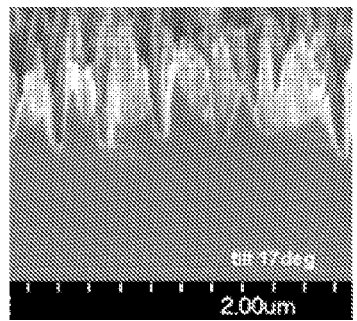
Fig. 5
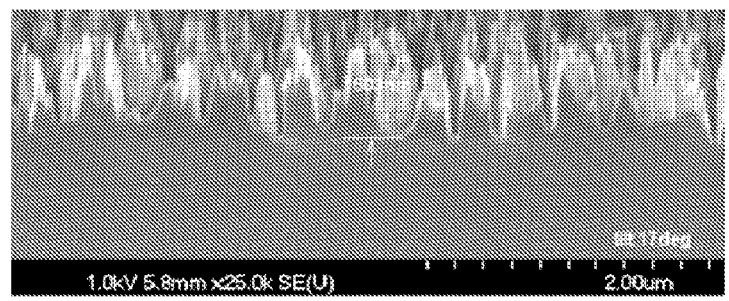
Fig. 6
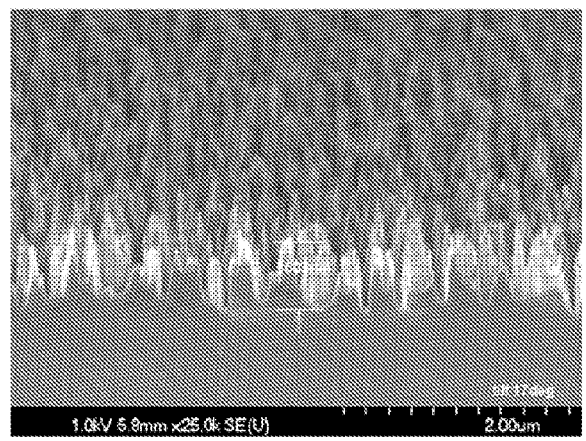

SELF-ORGANIZED PIN-TYPE NANOSTRUCTURES, AND PRODUCTION THEREOF ON SILICON

FIELD OF THE INVENTION

The invention generally relates to the fabrication of patterned or structured silicon surfaces and in particular relates to the creation of pin-type structures having nano dimensions in the range below, for instance, the wavelength of visible light, wherein hereinafter these structures are referred to as nanostructures.

RELATED ART

Many electronic, opto-electronic, sensoric and micromechanical devices comprise silicon as a component in doped and/or undoped, crystalline and/or polycrystalline and/or amorphous state. In order to meet the corresponding device specific requirements the silicon has therefore usually to be processed accordingly, which frequently involves a patterning of the silicon.

For the patterning of silicon usually a mask of photoresist is generated, by means of which the removal is controlled by an etch process, for example WO-A 2005/045941. In order to generate small structures or patterns by means of a resist mask the photoresist has to be exposed by an exposure mask having corresponding small structures. In the range below the usual light wavelengths that are available for the exposure of the photoresist, this is possible with increased effort only. However, frequently patterns having features or structural elements with high aspect ratio are required, i.e. the depth or height of the structural elements is small compared to their lateral dimensions. When, for instance, recesses and thus also protrusions having nano dimensions are required on a silicon surface based on an aspect ratio of 2 (two), a local material removal has to be performed that results in a recess of for example 200 nm at a lateral extension of 100 nm. In an etch process on the basis of a photoresist mask the mask has also to be manufactured with comparable dimensions and has also to exhibit the required etch selectivity so as to also obtain the desired aspect ratio during the subsequent silicon etch process. Alternatively, highly resolving masks may also be written by means of an electron beam (e-beam).

These approaches are very flexible but are also complex and expensive. Therefore, there are continuous efforts in finding alternative solutions that may also allow the patterning within the range of nanometers. Hereby are included:

Anistropic Wet Chemical Etching, cf. P. M. M. C. Bressers, J. J. Kelly et al. J. Electrochem Soc., Vol. 143 (5) 1744 (1996), Interference Lithography, cf. S. J. Wilson and M. C. Nutley, Optica Acta, Vol. 29 (7), 993 (1982)), Micromasking, or WO-A 0213279.

For example, Defects in Material, cf. Masakazu Kanechia et al., J. Vac. Sei. Technol. B 20(5), 1843 (2002)), not fully covered layers, cf. H. W. Deckman and J. H. Dunsmuir, Appl. Phys. Lett. 41 (4), 377 (1982) and self organisation effects were used, cf. R. M. Bradley, J. M. E. Harper, J. Vac Sei. Technol. A6, 2390 (1988), G. Ehrlich and F. G. Hudda, J. Chem. Phys. 44, 1039 (1966).

For all mentioned techniques it is common that high aspect ratios of the nanostructures are not achieved, in particular when a low defect density is desired. In the above cases, the nanostructure typically has an increased contamination density and/or an increased number of crystal faults after fabrication, when initially a single-crystalline silicon having a low crystal fault density was provided. Therefore, these known techniques are usable in a restricted manner or with inferior results with respect to the overall performance of the device. In some of these conventional techniques also plasma assisted techniques with reactive ions, also known as RIE technique, on the basis of $SF_6$ (sulphur hexafluoride) and oxygen were used for the micro patterning by using the self-organization so as to create patterned silicon surfaces, wherein, however, metal particles provide for the micromasking and thus for the formation of the structure, cf. WO-A 02/13279, U.S. Pat. Nos. 6,091,021, 6,329,296.

A significant disadvantage of this technique is the usage of metals in the plasma, which may result in an undesired contamination of the silicon. The disadvantageous influences of even minute metal traces in the semiconductor manufacturing process, in particular for integrated circuits, are well known. In addition to the contamination effect of the RIE tool due to addition of metals also the additional effort of these techniques in view of an application in manufacturing processes requiring high yield and reduced production cost is to be considered as a disadvantage.

SUMMARY OF THE INVENTION

It is an object of the invention to provide structures on silicon surfaces so as to have a high aspect ratio and nano dimensions, wherein an effort for a dedicated masking is to be avoided or at least to be reduced and wherein an enhanced behavior with respect to crystal faults and chemical surface contaminations is to be obtained compared to conventional techniques, wherein also a high degree of compatibility with further manufacturing processes should be obtained.

According to one aspect of the invention the object is solved by a method for fabricating a patterned silicon surface, as is described in claim 1. For this purpose, a reactive plasma atmosphere including at most two different gas components including oxygen and a reactive gas for etching silicon is established by adjusting process parameters that create a self-masking effect for generating a nanostructure. The etch process is performed without any further working gases and is performed as a single step process.

After establishing the plasma atmosphere the silicon surface is exposed to the etch plasma without performing further process steps, in particular no further measures are required so as to obtain a specific micromasking of the silicon surface. On the other hand, practically a "defect-free state" is achieved in the sense that defects may not be added by the reactive plasma. Crystalline stacking faults are avoided. These are structural features of the silicon structure obtained. For this structure the aspect ratio of the pin-type structures obtained in the reactive plasma atmosphere is adjusted to a value of 4 or higher by controlling the process time.

Thus, according to the invention a masking of the silicon surface, for instance by photoresist or other substances, such as aluminum, gold, titanium, polymers, water or possible surface contaminations and the like may be avoided.

The pin-type structures created by the inventive method have a highly appropriate shape for optical applications in the range of the visible light and also in the infrared range. That is, the shape of the pin-type structures created by the self-organized masking during the etch process additionally exhibits a "pyramid-like" shape in addition to an aspect ratio of greater than 4, wherein a very sharply tapering pin end or tip is obtained, while at the foot of the shape terminating in a pyramid-like manner a moderately terminating portion is obtained in the upper portion, which bottoms out in a shallow manner. The lateral dimensions significantly increase at the foot. Between the pyramid-like structures having a pin-type tip, as described above, a significant distance, at least 50 nm, remains such that, despite a high density of pins, pins that are positioned too densely are avoided. Pins with too high a density would merge into a larger component and would stop the etch process at this location.

The shapes specified by the descriptions are not individually identical, but on average and in a statistical distribution these shapes appear regular and each of the shapes is individually precisely distinguished. Their density distribution nevertheless amounts to approximately 50 "pyramid-like pins" per square micrometer, that is, at least significantly below 100 pins per $\mu m^2$, with a height of the pyramid-like pins of higher than 400 nm, in particular in the range of 500 nm and for a comparable depth of a spacing between the pyramid-like pins. Between neighboring ones of such pins the spacing having a width of at least 50 nm is maintained, which converges only at the foot of the pyramid-like shape, where the foot portion is moderately flat and terminates in a quite shallow manner. The pyramid should not be understood such that only four side faces are present; more side surfaces are also possible, up to a multi-sided pyramid shape and also up to an approximately round shape in the cross-section.

In other words, most of the regularly distributed pyramid-like pins have a sharp pin or needle, while in the lower adjacent height section a pyramid-like shape is provided and in the foot portion they laterally broaden while terminating in a relatively flat manner, that is, deviating from a pyramid shape.

These pyramid-like pins can be exposed to significant mechanical stresses. At most, they are bent or smeared but not destroyed. Mechanical stresses of the following type do not result in a destruction of the mechanical pin structure such that deleterious consequences with respect to the reflectivity of the nanostructure including the pyramid-like pins are created:

uniform area-like pressure perpendicularly to the pins;
AFM in contact mode;
profilometer.

A stylus of a profilometer exerts a pressure between 0.1 and 10 mg on the sample to be measured (the nanosurface containing the pyramid-like pins). The profilometer stylus is very sharp, while a diameter thereof however rapidly increases so that upon moving on a measurement sample a recess of 5 $\mu m$ depth and with a width of 1 $\mu m$ may not be precisely resolved in the measurement image. At a pressure of usually 5 mg and a movement of the profilometer stylus with a speed of up to 100 $\mu m/sec$ on the nanostructure no disadvantageous influence on the reflection characteristics of the nanostructure was observed, as would be the case upon destruction of the pyramid-type pin structure.

In total, already for an average length or height of the structures of approximately 400 nm to 500 nm and below 1000 nm a very efficient antireflective behavior in the visible range and also up to 3000 nm or higher could be verified.

Moreover, this characteristic implicitly describes the structures of the "pyramid-like pins". The (total) reflectance is below 0.4% for a wavelength range between 400 nm and approximately 1000 nm (scattered and direct reflection). In an extended range between 180 nm and 3000 nm the (total) reflectance is below 2% (practically only the scattered reflectance). The reflectance is a physical characteristic of the nanostructure, which is reproducible, measurable and comparable to other structures.

Without intending to restrict the present invention to the following explanation, investigations performed by the inventors indicate that the efficient self-organized masking (as "self-masking") is achieved by the etch process itself and not by already existing or specifically added substances. Corresponding investigations on the basis of Auger electron spectroscopy (AES) and energy dispersion Xray spectroscopy (EDX) indicate that the masking effect is created by $SIO_x$ so that a strong shielding effect is obtained by the locally formed silicon oxide. In total, this results in a moderately low silicon consumption during the creation of the pin-type structures having the "pyramid-like shape" and having at the same time a high aspect ratio and an existing spacing so that the inventive method may advantageously and efficiently be employed in semiconductor fabrication in many fields at a high degree of process compatibility.

Also, defects for a specific mask formation are not used. Instead of using a specific masking prior to an etch process therefore the previously described self-organized masking caused by the specific process conditions during the etch process is used instead. By combining the self-masking and the etching during the RIE process it is thus possible to create self-organized pyramid structures in the range of nanometers by the plasma. In this way it is possible to convert a regular smooth silicon surface, from a statistical point of view, into an ordered pin structure in the nanometer range, that is, with lateral dimensions in the range below the standard light wavelength, for instance the wavelength range of the visible light. Generally, in this manner, an excellent homogeneity of the reflection behavior is obtained across the entire wafer.

Moreover, by a single etch step the preventive method allows to significantly reduce or to substantially avoid, within measurement tolerances, the number of contamination defects, which may for instance be typically caused by etch byproducts, as well crystal faults, which are typically observed in conventional plasma assisted techniques. For example, such defects could not be observed by RHEED, CV measurements, TEM or PDS—a consequence of the inventive etch regime. Also a simple photodiode, for instance emitting blue light, whose surface was processed by these techniques did not exhibit any specifics that lead to an increased defect density. Thus, the nanostructure may be fabricated by a single plasma etch step with a quality that does not require a further material removal.

The structures created by the method do not exhibit an edge shielding or shading at high edges. Hence, it is possible, for instance, to pattern areas of a few micrometers, even if the area is laterally enclosed by a structure having a height of 5 $\mu m$.

The patterning of the silicon is achieved by the plasma in the RIE process. These structures are strongly deepened by the etch process, thereby resulting in the structures in the nanometer range having the enormous aspect ratios.

In the dependent claims 2 to 11 further preferred embodiments of the previously described methods are provided.

In one embodiment the process is performed with a working gas consisting of $SF_6$ and $O_2$. In this case the pin-type structures are formed with low defect rate, that is, with a low crystal fault density and low surface contamination, irrespective of the crystallographic orientation of the silicon base surface, thereby providing a high degree of flexibility for implementing the inventive method into corresponding manufacturing processes for silicon-containing devices.

In other embodiments a different combination of working gases including $O_2$ as a component is used. For instance, carbon fluoride in combination with oxygen as the second gas component may be used. Each of $SF_6$ or one of the other reactive gases previously mentioned, is in addition to oxygen, the second of the two gas components and is in this case the actual etch gas, whereas $O_2$ increases the etch rate and causes the self-masking (passivation). Also, it provides for a high selectivity with respect to $SiO_2$ regarding the etch behaviour such that an efficient restriction of the silicon surface to be patterned is possible by means of a corresponding mask layer.

The result obtained thereby has a nanostructure surface with reduced defects (claim 27, claim 33, claim 32). It has a height of the isolated pyramid-like pins above at least 400 nm and a spacing of at least 50 nm. The height is between 400 nm and 1000 nm, as is described by the contraction factor of the image of the electron microscopy image (claim 33). The claim in the form of an image is provided due to the only restricted possibility for structurally describing the pyramid-like pins and their neighborhood. As a comparison, it may be referred to the John Hancock Centre in Chicago, which is 350 m high, slightly pyramid-like and which has a lateral extension at the foot (without a shallow relatively flat termination) of approximately 85 m. This structure is formed in silicon with a shape reduced by a factor of $10^9$ with high multiplicity placed side by side and is difficult to be made visible and precisely to be described as scaled by presently available image-based techniques. This task is, on the one hand, not trivial, however, on the other hand substantially fulfilled in that the effects of these structures are measured and demonstrated.

As described in further embodiments, the temperature of the silicon wafer and the ratio of the working gases are appropriately adjusted at the reaction point on the silicon surface.

In one preferred embodiment the temperature of the silicon surface is set to 27° C., preferably in the range of ±5° C. In this manner, an efficient adjustment of the further process parameters, such as the flow rates as specified in the claims and in the following description, may be accomplished since the temperature that typically represents a "sensitive" parameter, is determined in a very precise manner.

Also the process pressure and the plasma power are appropriately adjusted to each other, as is also described in the dependant claims and supported by the following description, in order to obtain the desired aspect ratio while concurrently providing a reduced contamination rate and a low crystal fault density.

In particular, by maintaining an oxygen component in the specified manner the ratio of not more than two working gases is adjusted such that the etch removal and the self-masking balance each other. In this manner, the patterning and the required defect-free state is ensured (no additional defects due to the etch regime).

In the inventive method the absolute parameter values may efficiently be adapted to the fraction of the open (or exposed) silicon surface. When the Si surface is covered by a mask layer, for instance by oxide or silicon nitride, to a high area fraction, this may be balanced by at least increasing the reactive gas fraction, for instance the fraction of $SF_6$, in particular by increasing the $SF_6$ fraction while concurrently reducing the oxygen content and simultaneously increasing the process pressure.

By the previously described process it is possible to produce the claimed nanometer structure with a high and adjustable aspect ratio within a short time period by means of a simple RIE tool having a parallel plate reactor. This may be accomplished in large areas with a targeted adaptation of the process parameters and is also possible in smallest areas so that individual devices, for instance sensor portions, optically active portions of opto-electronic devices and the like may specifically be provided with a corresponding nanostructure without negatively influencing other device regions. Portions not to be patterned may readily be protected by, for instance, an oxide mask. Furthermore, due to the low contamination rate and the low crystal fault density an immediate further processing after the fabrication of the area-like nanostructure may be performed, without requiring complex preparation and/or post-process processing.

The above-mentioned object is solved according to a further aspect by a method having the features of claim 12.

The method comprises the creation of a reactive plasma atmosphere including oxygen and a reactive gas consisting of a mixture of HCl and $BCl_3$ for etching silicon without further process steps by adjusting process parameters, which provide for a self-masking effect for creating a nanostructure having pin-type structures. Also in this case a self-organizing masking effect may be accomplished such that the previously described characteristics (or shapes) of the nanostructure are obtained.

Further preferred embodiments are also defined in the associated dependent claims, wherein the previously described effects may be obtained and in particular also pin-type silicon structures having an aspect ratio of greater than 4 may be fabricated.

According to a further aspect the object is solved by a method according to claim 18 in which the fabrication of silicon structures having an aspect ratio of 4:1 or higher in a single plasma etch step is described, wherein the self-masking effect is obtained on the basis of oxygen and a reactive gas, for instance $SF_6$ and wherein concurrently the defect rate with respect to contamination and crystal faults is maintained low.

Further advantageous embodiments of this method are defined in the associated dependent claims.

According to a further aspect of the invention an area-like extended nanostructure is provided which comprises statistically distributed single-crystalline pin-type silicon structures formed on a single-crystalline silicon base layer, wherein the aspect ratio of the pin-type silicon structures is 4 or higher, and wherein the crystal fault density in the silicon structure is not higher than in the silicon base layer (claim 27).

The nanostructure, which thus comprises silicon structures having lateral dimensions that are typically below the wavelength of the visible light, may thus be used in an efficient manner as a layer in devices in which a gradual variation of the index of refraction between silicon and another material is desired. In this manner, the reflection behaviour and/or the transmission behaviour of opto-electronic devices may significantly be enhanced. Furthermore, a significantly increased surface area may be obtained by the nanostructure, thereby resulting, for instance, in a significant increased retention of substances in the vicinity of the nanostructure compared to substantially planar surfaces, which may be taken advantage of in sensor applications. Due to the crystal fault density, which is identical to that of the silicon base layer, the nanostructure may also efficiently be used in applications in which a high crystal quality is required for the further processing.

In a further advantageous embodiment the silicon structures are ordered by a mask layer wherein the silicon structures are formed up to (close to) the corresponding edge (edge flank). In this manner the nanostructure may efficiently be used as a window of an opto-electronic device. In this case the mask layer may even have a thickness of several micrometers, for instance 5 μm, such that efficient passivation layers may be used in order to expose desired areas of a silicon base layer with respect to forming a nanostructure.

BRIEF DESCRIPTION OF THE DRAWINGS

The invention will now be explained on the basis of embodiments while also referring to the drawings. In the drawings FIG. 1 is an electron microscope image of an RIE etched silicon surface in cross-section in a portion that is partially covered by an oxide layer, FIG. 2 is an electron microscope image of an obliquely incident electron beam, wherein the homogeneity of the distribution of the silicon pins and the depth of the spacings between the pins is visible, FIG. 3 is a TEM electron microscope image of the tip of a silicon pin in transmission mode at high resolution, FIG. 3a is FIG. 3 rotated such that [001] is perpendicular.

FIG. 4a is an electron microscope image of FIG. 2 of an obliquely incident electron beam, wherein the homogeneity of the distribution of the silicon pins and the depth of the spacings between the pins is visible, here a left portion;

FIG. 4b is an electron microscope image of FIG. 2 of an obliquely incident electron beam, wherein the homogeneity of the distribution of the silicon pins and the depth of the spacings between the pins is visible, here an intermediate portion;

FIG. 4c is an electron microscope image of FIG. 2 of an obliquely incident electron beam, wherein the homogeneity of the distribution of the silicon pins and the depth of the spacings between the pins is visible, here a right portion;

FIG. 5 is an electron microscope image of FIG. 2 of an obliquely incident electron beam, wherein the homogeneity of the distribution of the silicon pins and the depth of the spacings between the pins is visible, here a front portion;

FIG. 6 is an electron microscope image of FIG. 2 of an obliquely incident electron beam, wherein the homogeneity of the distribution of the silicon pins and the depth of the spacings between the pins is visible, here complete.

DETAILED DESCRIPTION

FIG. 1 illustrates a silicon-containing device 1 having a nanostructure 2 which comprises a single-crystalline silicon base layer 3 on which pin-type silicon structures 4 are formed. In this application pin-type silicon structures are to be understood as "pyramid-like" structures having a tip with lateral dimensions of a few nanometers, wherein the tip increases significantly in its lateral dimensions towards its bottom portion so that in a lower portion of the structure a lateral dimension of 10 nm or at least 100 nm is obtained. In this embodiment the silicon base layer 3 is delineated by a mask layer 5, which may be comprised of silicon dioxide, silicon nitride and the like, wherein the pin-type silicon structures 4 are formed up to an edge area 5a of the mask layer 5. In the embodiment shown the silicon base layer 3 is a part of a silicon wafer with a diameter of 6 inches and with a (100) surface orientation having a p-type doping that results in a specific resistivity of 10 Ohm*cm.

As is explained above, the base layer 3 may however have an arbitrary crystal orientation with any appropriate pre-doping. In alternative samples the base layer 3 may be made of substantially amorphous or polycrystalline silicon.

FIG. 2 illustrates an enlarged portion of the nanostructure 2 wherein the angle of incidence of the probing electron beam has a tilt angle of approximately 17° in order to more clearly demonstrate the size ratios in the lateral direction and in the height or thickness direction of the pyramid-like structures 4. As is evident from FIGS. 1 and 2, the silicon structures 4 have a height that is on average approximately 1000 nm so that in some embodiments a height is obtained that is greater than the wavelength of the visible light. In the scale of 2 μm 10 scale fractions are plotted in FIG. 2. In FIG. 1 there are 500 nm per scale unit.

Due to the tilted electron beam of 17° the height in FIG. 2 illustrated as a measure of 603 nm is to be recalculated into the real height. Also the height extension may be recalculated up to 60% for the lower pyramid-like pins, which have their effects beginning at approximately 400 nm. This may be achieved by contracting FIG. 2 in the height direction by 40% of the illustrated height.

However, also pyramid-like structures 4 having an average height in the range of 400 nm exhibit excellent optical characteristics in many applications. For instance, for an average height of 400 nm an excellent antireflective behaviour could be observed in the visible wavelength range up to 3000 nm.

As is evident from FIG. 1, a maximum average height of the silicon structures 4 may also be at approximately 1000 nm.

On the other hand FIGS. 1 and 2 illustrate that the lateral dimension of the silicon structures (at the bottom or foot) is typically less than 100 nm or significantly less so that on average an aspect ratio of height to lateral dimension of 4 or even higher is obtained.

The results shown in FIGS. 1 and 2 that relate to a 6 ins (100) Si wafer having a p-type doping, a 10 Ohm*cm resistivity and an area fraction of the oxide mask of greater than 90% (up to substantially 93%) were achieved in a single step plasma etch process in a tool comprising a parallel plate reactor of the type STS 320 on the basis of the following parameters:

$SF_6$— gas flow rate: 100 sccm
$O_2$— gas flow rate: 20 sccm
Gas pressure: 70 mTorr
Temperature of the silicon wafer: 27° Celsius
Plasma power: 100 W
Self-adjusting BIAS (that is, the DC voltage potential between the plasma atmosphere and the surface to be etched): varies at about 350 V (is self-adjusting)
Etch time: 2 minutes In alternative examples comparable results were obtained for the nano patterned surface. Initial parameters and process parameters are given below.

For an area fraction of 0.1% silicon and 99.9% oxide mask the following parameters were used.

150 sccm $SF_6$
20 sccm $O_2$
91 mTorr
27° C.
100 Watt
Bias 28 V
4 mins etch time (process time)

For a 100% silicon surface, that is, a bare silicon wafer
65 sccm $SF_6$
23 sccm $O_2$
50 mTorr
27° C.
100 Watt
10 to 20 minutes etch time (process time)

For bare silicon wafers even a process time of up to 20 minutes is reasonable. In this case, an extremely high quality antireflective behaviour of the surface comprising the nano patterned surface is obtained.

In other embodiments gas flow rates between 50 to 150 sccm for the reactive gas, that is, for $SF_6$, $C_nF_m$ or $HCl/BCl_3$ were used. Gas flow rates from 20 to 200 sccm are used for oxygen. Moreover, in some embodiments the temperature of the substrate and thus of the base layer 3 is adjusted to a range of 27° C.±5° C.

The 6 ins (inch) wafer rested on an 8 ins wafer in the tool RIE STS 320 and also adjacent to the 8 ins wafer the plasma may be effective. A power density can be given only in first approximation of an estimation. The plasma power may be adjusted in the range of 100 W to 300 W, which corresponds to a power density of approximately 4 W/cm$^2$ to 12 W/cm$^2$ for a 6 ins wafer.

From the above information corresponding parameter values for other etch tools and other degrees of coverage of the silicon base layer 3 to be patterned with the pyramid-like structures may be obtained. For example, a reduced degree of coverage of the silicon base layer may be taken into consideration by a reduced gas flow rate of the reactive gas.

If there is no mask provided, the reactive gas fraction may be less and vice versa.

Generally, based on the above settings the Si pins 4 having a height of approximately 1000 nm were obtained in statistical distribution in areas not covered by the mask layer 5.

Silicon oxide or silicon nitride is appropriate for the mask layer 5.

Processed wafers having the same structures (without oxide mask) became completely black and showed a reflectance of less than 0.4% for the wavelength range from 400 nm to 1000 nm while at the same time exhibiting excellent homogeneity of this characteristic across the entire wafer. In particular, for a wavelength range extending beyond the above values at both directions between 180 nm to 3000 nm of wavelength the investigations exhibited still an excellent anti-reflective behaviour with a reflectance below 2%. In this case, the reflectance related (practically exclusively) to the reflections into the entire solid angle.

Furthermore, any crystal damage as well as any contamination that may be caused by the plasma assisted single step patterning process are very low and are below detectability in the illustrated embodiments. Any residual substances after the plasma patterning process were not detectable and the crystal quality of the silicon structures is nearly identical to the crystal quality of the silicon base layer prior to the etch process.

As is evident from FIG. 3, the pin sections of the pyramid-like pins are approximately atomically sharp at their end or tip 4a. The lateral dimensions of the tip 4a are a few nm. Moreover, the individual crystallographic planes (111) of the single crystalline pin section are clearly visible, while any crystal faults caused by the etch process are not observable.

FIG. 3 illustrates a single tip 4a or an end portion of the tip 4a of a pyramid-like pin 4. As is clearly evident, the pins are nearly atomically sharp at their tips 4a, that is, the lateral dimensions of the tip 4a are a few nanometers and thus are less than 10 nm. In the illustration of FIG. 3 the crystallographic direction perpendicular to the surface of the silicon base layer 3 is indicated. This direction corresponds to a [001] direction since for the embodiment shown the surface orientation is a (100) orientation. As is evident the end portion including the tip 4a extends substantially along the [001] direction with only a minimal deviation of less than 10° so that the structural elements are oriented nearly perpendicularly with few degrees of deviation with respect to the normal of the surface of the base layer 3.

FIG. 3a is oriented properly along the [001] direction. Based on FIGS. 3, 3a also the inclination of the sidewall of a pyramid-like pin may coarsely be determined. It is approximately 4° with respect to the normal [001].

Within the individual crystallographic planes the single crystalline pins do not exhibit any crystal faults caused by the etch process. In the configuration of the base layer shown the visible crystallographic planes correspond to (111) planes.

Due to the strongly patterned surface after the process the surface area is significantly increased, thereby also significantly changing the characteristics. The increased surface area provides a much greater area of attack for adhering molecules and therefore the sensitivity of sensors may significantly be increased.

As an example, it has been determined that gases may stay localized for a long time in the structure. In the optical field the pyramid-like structures 4 are interesting in that their lateral sizes are less than the light wavelength (VIS/NIR) and due to their pin-type shape, i.e. the reduced lateral dimension of the tip 4a and the moderately great dimension at the foot of the pyramid-like structure and due to the high aspect ratio a substantially perfect gradient layer is provided. The index of refraction changes gradually from the index of refraction of the silicon to the index of refraction of the medium surrounding the nanostructure 2, such as air.

Hence, the nanostructure 2 allows an impedance adaptation or an adaptation of the index of refraction, thereby resulting in an excellent broadband suppression of reflections. Furthermore, it is known that strong curvatures, as is the case for the pin tips 4a, are particularly suited for field emission.

Thus, a broad field of applications is obtained for the nanostructure 4 in many micro devices and also in other fields, such as solar cells, sensors and the like.

The embodiments thus provide methods and structures in which silicon structures having a high and adjustable aspect ratio are provided, wherein due to the (specific) parameter setting in the self-masking plasma etch process in a single etch step a contamination and the creation of plasma induced crystal faults is maintained at a low level such that the resulting structure may be immediately used further at low effort for the single step patterning process and without requiring any further post process steps, when pin-type silicon structures of high quality single crystalline form are required.

Furthermore, no additional complex surface preparations or additional measures for creating a micromasking are required. A preconditioning may be omitted.

By means of an RIE standard etch procedure for silicon a plurality of pin-type structures substantially without crystal faults, among others, with a high aspect ratio and with nano dimensions is obtained at the surface of a silicon wafer without any additional patterning measures (e-beam, interference lithography and the like) by means of self-organization, thereby obtaining, among others, a broadband antireflective behaviour. A plurality of applications is possible.

The invention claimed is:

1. A method for fabricating a patterned silicon surface, wherein the method comprises:
   establishing a reactive plasma atmosphere on the basis of at most two different gas components comprising oxygen and a reactive gas for etching silicon without an intermediate step and without using metals in said atmosphere by adjusting process parameters which provide a self-masking effect for generating a nanostructure including pin-type structures; and
   adjusting an aspect ratio of pin-type structures developing in the plasma atmosphere to a value of 4 or greater by controlling a process time of the exposure to the plasma atmosphere.

2. The method of claim 1, wherein a pressure in the plasma atmosphere is adjusted to less than essentially 300 mTorr.

3. The method of claim 1, wherein a temperature of the silicon surface is adjusted to 27° C.±5° C.

4. The method of claim 3, wherein a plasma power supplied to the plasma atmosphere is adjusted between 4 W/cm$^2$ and 12 W/cm$^2$ for a plane-like supported wafer having a silicon base layer.

5. The method of claim 1, wherein a gas flow rate of the reactive gas of the plasma atmosphere is adjusted to 50 sccm to approximately 150 sccm.

6. The method of claim 1, wherein a gas flow rate of oxygen is adjusted to 20 sccm to 200 sccm.

7. The method of claim 1, wherein the reactive gas is sulfur hexafluoride ($SF_6$).

8. The method of claim 1, wherein the reactive gas is carbon fluoride gas ($C_nF_m$).

9. The method of claim 1, further comprising restricting the formation of the pin-type structures by providing a mask that exposes a defined region of the silicon surface for exposure to the plasma atmosphere.

10. The method of claim 1, wherein the pin-type structures are used without any further reactive etch or cleaning process for completing a silicon-based device.

11. The method of claim 1, wherein an average height of the pin-type structures is greater than substantially 400 nm, wherein the pin-type structures are pyramid-like and have lower portions, the lateral dimensions of which significantly increase.

12. A method for fabricating a patterned silicon surface, wherein the method comprises:
    establishing a reactive plasma atmosphere using oxygen and a hydrogen chlorine (HCl) and boron chlorine ($BCl_3$) mixture for etching silicon without an intermediate step, without using metals in said atmosphere and without supplying further gas components, said etching performed by adjusted process parameters that provide for a self-masking effect to generate a nanostructure having pin-type structures, and
    controlling the process time to adjust an aspect ratio of the pin-type structures self developing in the plasma atmosphere of said oxygen, hydrogen chlorine (HCl) and boron chlorine (BCl3) mixture to a value of at least four.

13. The method of claim 12, wherein the pressure in the plasma atmosphere is adjusted to less than 300 mTorr.

14. The method of claim 12, wherein a temperature of the silicon surface is adjusted to 27° C.±5° and a plasma power supplied to the plasma atmosphere is adjusted between 4 W/cm$^2$ and 12 W/cm$^2$.

15. The method of claim 12, further comprising restricting the formation of the pin-type structure by providing a mask that exposes a defined region of the silicon surface for exposure to the plasma atmosphere.

16. The method of claim 12, wherein the pin-type structures are used without any further reactive etch or cleaning process for completing a silicon-based device.

17. The method of claim 12, wherein an average height of the pin-type structures is greater than 400 nm.

18. A method for fabricating pin-type structures having nanometer dimensions and an aspect ratio of greater than 4:1 on a silicon surface by a reactive ion etch process (RIE) while avoiding additional crystal faults and surface contaminations by using the work gases oxygen and only one of the following reactive components:
    $SF_6$, (HCl/$BCl_3$ and $C_n$, $F_m$,
    in a single process step, wherein no additional metals in said atmosphere for a specified mask formation are used and the process parameters are adjusted such that the oxygen exhibits a self-masking effect on the silicon surface during reaction providing self-organization of the developing pin-type structures.

19. The method of claim 18, wherein one of a wafer supporting the silicon surface and a body supporting a silicon layer are maintained at a substantially constant temperature of 27° C.±5° C., during the process with a plasma power of approximately 100 to 300 W.

20. The method of claim 18, wherein the gas flow rates are tool dependent and are between 50 sccm and 150 sccm for the gas $SF_6$ and are between 20 sccm and 200 sccm for oxygen.

21. The method of claim 18, wherein the process time is several minutes.

22. The method of claim 18, wherein the work gases are HCl/$BCl_3$ and $O_2$.

23. The method of claim 18, wherein the work gases are $C_nF_m$ and $O_2$.

24. The method of claim 18, wherein the work gases are $SF_6$ and $O_2$.

25. The method of claim 18, wherein the formation of the pin-type structures is restricted to defined regions by patterning a mask material that is previously applied.

26. The method of claim 25, wherein the mask material comprises at least one of silicon dioxide and silicon nitride.

27. A nanostructure comprising a single crystalline silicon base layer, and further comprising a plurality of statistically distributed pin-type single crystalline silicon structures having an aspect ratio of 4 or greater, wherein a crystal fault density in the silicon base layer is equal to a crystal fault density in the silicon structures and wherein most of the pin-type structures have a tip and are configured broader towards the silicon base layer resembling a pyramid shape with deep spacings between neighbouring pyramid-like silicon structures and wherein a foot portion terminates in a relatively shallow manner, and less than 100 pins are provided per $\mu m^2$ and wherein the needles are mostly individually sharply distinguished, wherein the pins in the nanostructure have a reflectance of less than 0.4% at a wavelength of an incident light between 400 nm and 1000 nm and for a measurement of the reflectance across the total solid angle.

28. The nanostructure of claim 27, further comprising a mask layer delineating the silicon base layer, wherein the pin-type silicon structures are formed up to the edges or flanks formed by the mask layer.

29. The nanostructure of claim 28, wherein the mask layer has a thickness of several micrometers.

30. The nanostructure of claim 28, wherein substantially no edge shadowing is created such that the pin-type structures extend closer to an edge of the mask layer than half of a height of the mask layer.

31. The method of claim 1, wherein the fabricating method advances in a self-organized process.

32. The method of claim 1, wherein a deep spacing having a width of at least 50 nm is provided between neighboring pins.

33. The method of claim 1, wherein the pins in the nanostructure are not destroyed when exposed to significant mechanical stress.

34. The method of claim 21, wherein the process time is between 10 minutes and 20 minutes, for a bare silicon wafer.

* * * * *